United States Patent
Lee et al.

(10) Patent No.: US 11,740,273 B2
(45) Date of Patent: Aug. 29, 2023

(54) METHOD AND SYSTEM FOR TESTING RADIATION SUSCEPTIBILITY

(71) Applicants: Inventec (Pudong) Technology Corp., Shanghai (CN); Inventec Corporation, Taipei (TW)

(72) Inventors: Yung-Sen Lee, Taipei (TW); Yuan-Ho Chen, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 17/842,764

(22) Filed: Jun. 16, 2022

(65) Prior Publication Data

US 2023/0085501 A1 Mar. 16, 2023

(30) Foreign Application Priority Data

Sep. 13, 2021 (CN) .......................... 202111068639.X

(51) Int. Cl.
*G01R 19/00* (2006.01)
*G01R 29/08* (2006.01)
*G01R 29/10* (2006.01)

(52) U.S. Cl.
CPC ....... *G01R 29/0821* (2013.01); *G01R 29/105* (2013.01)

(58) Field of Classification Search
CPC ............ G01R 29/0814; G01R 29/0821; G01R 29/0878; G01R 29/0892; G01R 29/0871; G01R 29/105; G01R 31/001; G01R 1/0018
See application file for complete search history.

(56) References Cited

U.S. PATENT DOCUMENTS

| | | | |
|---|---|---|---|
| 5,311,116 A * | 5/1994 | Rogers | G01R 31/002 324/72 |
| 5,552,715 A * | 9/1996 | Rogers | G01R 29/0814 324/72 |
| 6,995,569 B2 * | 2/2006 | Jecko | G01R 29/0871 324/642 |
| 11,047,894 B2 * | 6/2021 | Kvarnstrand | G01R 29/0871 |
| 2021/0190856 A1 * | 6/2021 | Shiota | G01R 31/2875 |
| 2022/0128610 A1 * | 4/2022 | Rowell | G01R 29/105 |

* cited by examiner

*Primary Examiner* — Thang X Le
(74) *Attorney, Agent, or Firm* — Winston Hsu

(57) ABSTRACT

A radiation susceptibility testing method includes transmitting radiation waves to a device under test, measuring the device under test to obtain a first voltage according to the radiation waves, outputting a reference voltage to a coupling device so that the coupling device generates a second voltage according to the reference voltage, adjusting the reference voltage to approximate the second voltage to the first voltage, storing the adjusted reference voltage, and outputting the second voltage to the device under test according to the adjusted reference voltage to simulate the impact of the radiation waves to the device under test.

10 Claims, 5 Drawing Sheets

METHOD AND SYSTEM FOR TESTING RADIATION SUSCEPTIBILITY

BACKGROUND OF THE INVENTION

1. Field of the Invention

The disclosure is related to a method and a system for testing radiation susceptibility, and more particularly, a method and a system for testing radiation susceptibility by simulating the impact of the radiation waves to the device under test.

2. Description of the Prior Art

The radiated susceptibility (RS) testing is critical for electronic equipment, such as computers and servers. Due to the ubiquity of electromagnetic fields, if the radiation susceptibility test cannot be passed, the electronic equipment may be disturbed by the radiation waves, resulting in functional failure and damage.

Currently, for testing radiation susceptibility, electronic equipment must be placed in an anechoic chamber, the radio waves are transmitted to the electronic equipment, and the impact on the electronic equipment is measured. If the electronic equipment fails the test, engineers must enter the anechoic chamber to adjust the settings and repeatedly perform the relevant operations to debug through trial and error.

This process consumes a lot of resources and time, is unable to find the root cause of the error easily. In addition, it is harmful to the safety and health of the engineers because the engineers have to enter the high radiation area frequently.

SUMMARY OF THE INVENTION

An embodiment provides a radiation susceptibility testing method, including transmitting radiation waves to a device under test, measuring the device under test to obtain a first voltage according to the radiation waves, outputting a reference voltage to a coupling device so that the coupling device generates a second voltage according to the reference voltage, adjusting the reference voltage to approximate the second voltage to the first voltage, storing the adjusted reference voltage, and outputting the second voltage to the device under test according to the adjusted reference voltage to simulate an impact of the radiation waves to the device under test.

Another embodiment provides a radiation susceptibility testing system, including a coupling device, a signal generator and a device under test. The coupling device includes a first terminal for receiving a reference voltage, a second terminal for outputting a second voltage corresponding to a first voltage according to the reference voltage, and a third terminal. The signal generator is coupled to the first terminal of the coupling device for outputting the reference voltage. The device under test is coupled to the second terminal of the coupling device for receiving the second voltage. A first voltage is measured when radiation waves are transmitted to the device under test, and the reference voltage is adjusted to approximate the second voltage to the first voltage for simulating an impact of the radiation waves to the device under test.

These and other objectives of the present invention will no doubt become obvious to those of ordinary skill in the art after reading the following detailed description of the preferred embodiment that is illustrated in the various figures and drawings.

DETAILED DESCRIPTION

In order to deal with the abovementioned problem, a method and a system for testing radiation susceptibility are provided as described below.

According to an embodiment, an antenna can transmit radiation waves to a device under test (DUT) in an anechoic chamber. The device under test can be measured to obtain a corresponding first voltage. Radiation waves with different frequencies (e.g. 100 MHz, 125 MHz, 250 MHz, 400 MHz and 1,000 MHz) can be applied to generate different first voltages. Then, a signal generator can provide a reference voltage to a coupling device, and the coupling device can output a second voltage to the device under test according to the reference voltage. The reference voltage can be adjusted to approximate the second voltage to the first voltage, and the adjusted reference voltage can be stored. After that, the anechoic chamber is not used. The stored reference voltage can be applied to the coupling device, and the coupling device can accordingly output the second voltage to the device under test for simulating the impact of the radiation waves to the device under test.

Figure 1:
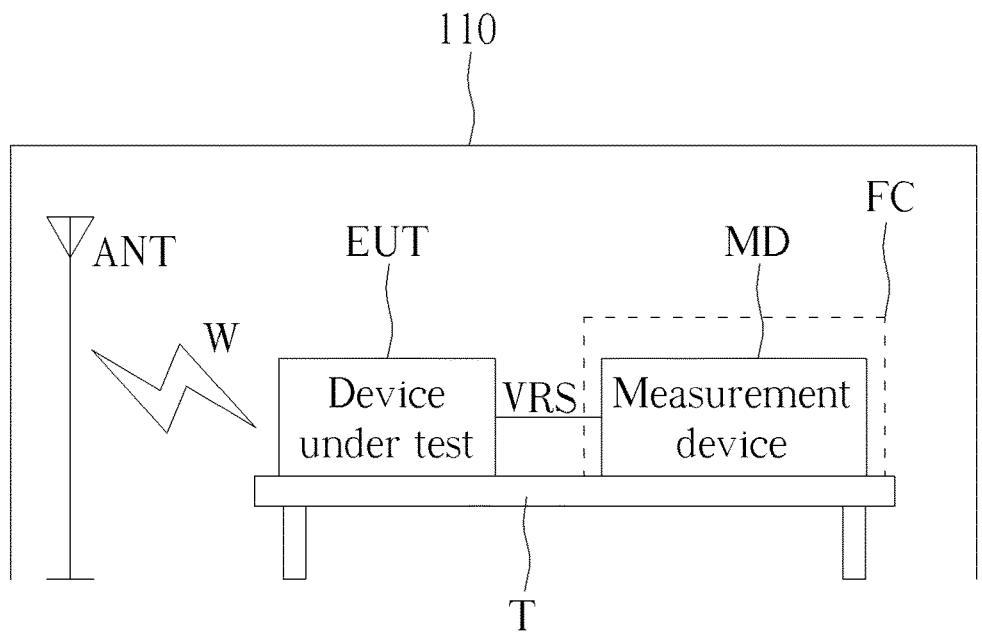
FIG. 1 illustrates radiation waves being transmitted to a device under test according to an embodiment.
Figure 2:
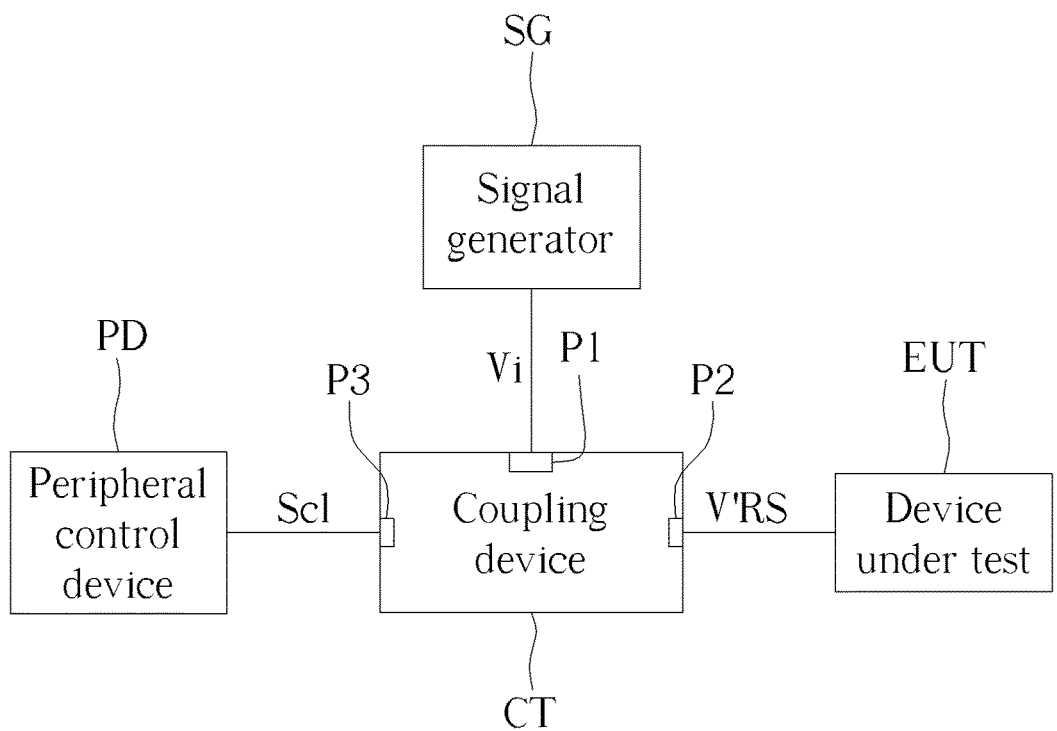
FIG. 2 illustrates a coupling device being used for simulating the impact of the radiation waves to the device under test.
Figure 3:
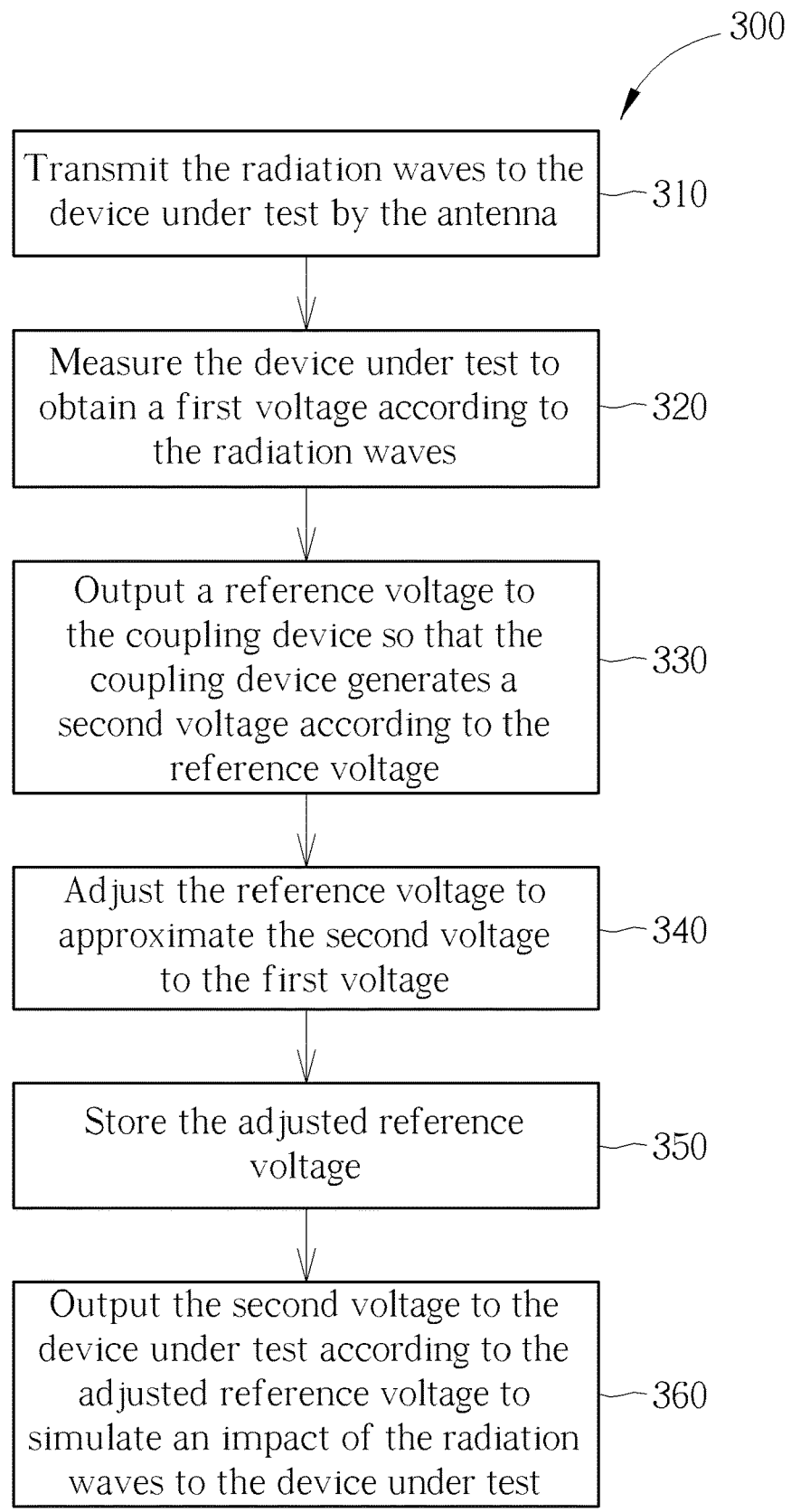
FIG. 3 illustrates a flowchart of a radiation susceptibility testing method according to an embodiment.

FIG. 1 illustrates radiation waves W being transmitted to the device under test EUT according to an embodiment. FIG. 2 illustrates a coupling device CT being used for simulating the impact of the radiation waves W to the device under test EUT. FIG. 3 illustrates a flowchart of a radiation susceptibility testing method 300 according to an embodiment. FIG. 1 can be related to Step 310 and Step 320 of FIG. 1. FIG. 2 can be related to Step 330 to Step 360 of FIG. 3. As shown in FIG. 1 to FIG. 3, the radiation susceptibility testing method 300 can include the following steps.

Step 310: transmit the radiation waves W to the device under test EUT by the antenna ANT;

Step 320: measure the device under test EUT to obtain a first voltage VRS according to the radiation waves W;

Step 330: output a reference voltage Vi to the coupling device CT so that the coupling device CT generates a second voltage V'RS according to the reference voltage Vi;

Step 340: adjust the reference voltage Vi to approximate the second voltage V'RS to the first voltage VRS;

Step 350: store the adjusted reference voltage Vi; and

Step 360: output the second voltage V'RS to the device under test EUT according to the adjusted reference voltage Vi to simulate an impact of the radiation waves W to the device under test EUT.

As shown in FIG. 1, Step 310 and Step 320 can be performed in an anechoic chamber 110, where the radiation waves W transmitted by the antenna ANT can have a predetermined frequency. For example, the measurement device MD can be an oscilloscope, such as a digital storage oscilloscope (DSO). As show in FIG. 1, the measurement device MD can be disposed in a Faraday cage FC to avoid being affected by the radiation waves. The device under test EUT can include a network cable and a network connector. The network cable can be Category (CAT) cable, such as CAT 5E cable. The network connector can be registered jack (RJ) connector, such as RJ 45 LAN connector. Hence, the radiation susceptibility of the network cable and the network connector can be tested. As shown in FIG. 1, the measurement device MD and the device under test EUT can be placed on a working table T. The working table T can be an insulated table, such as a wooden table, to comply with testing-related specifications.

After measurement and calculation, the first voltage VRS can be similar to the second voltage V'RS with only a phase difference between the waveforms, and the second voltage V'RS can simulate the first voltage VRS. Hence, simulation of the impact of the radiation waves W can be performed with the second voltage V'RS.

As shown in FIG. 2, in Step 330 to Step 350, the coupling device CT and the signal generator SG can be used to generate the second voltage V'RS to simulate the impact of the radiation waves W. The coupling device CT can have a first terminal P1, a second terminal P2 and a third terminal P3. The first terminal P1 can receive the reference voltage Vi. The second terminal P2 can output the second voltage V'RS corresponding to the first voltage VRS (shown in FIG. 1) according to the reference voltage Vi. The third terminal P3 can be coupled to a peripheral control device PD for accessing a first control signal Sc1. The first control signal Sc1 is further described below. Since the coupling device CP has the first terminal P1 to the third terminal P3, the coupling device CP can be a three-port coupling device.

The signal generator SG can be coupled to the first terminal P1 of the coupling device CT to output the reference voltage Vi. The device under test EUT can be coupled to the second terminal P2 of the coupling device CT to receive the second voltage V'RS. The reference voltage Vi can be positively correlated to a sum of the second voltage V'RS and a calibration factor CF. It can be expressed as the equation eq-1:

$$Vi=V'RS+CF \qquad \text{eq-1.}$$

As shown in Step 340 and Step 350, the reference voltage Vi can be adjusted to approximate the second voltage V'RS to the first voltage VRS obtained in Step 320. For example, the difference of the second voltage V'RS and the first voltage VRS can be adjusted to be less than 10%, 5% or 1% of the first voltage VRS. As mentioned in Step 360, the second voltage V'RS generated according to the adjusted reference voltage Vi can be outputted to the device under test EUT to simulate the impact of the radiation waves W to the device under test EUT.

Step 310 to Step 350 can be repeatedly performed to generate a plurality of reference voltages Vi corresponding to different frequencies. For example, in Step 310, the radiation waves W can have a first frequency, so the adjusted reference voltage Vi in Step 340 and Step 350 can be corresponding to the first frequency. Then, the radiation waves W can be adjusted from the first frequency to a second frequency for generating another adjusted reference voltage Vi corresponding to the second frequency, and so on.

Through multiple calibrations and operations, a lookup table of multiple frequencies and multiple reference voltages Vi can be generated. Afterwards, if radiation waves W of a predetermined frequency are to be applied to the device under test EUT, the corresponding reference voltage Vi can be used for outputting the second voltage V'RS to the device under test EUT (as shown in FIG. 2) to perform a simulation. For example, the frequencies corresponding to the reference voltages Vi in the lookup table can range from tens to hundreds of megahertz (MHz), and less than 1 gigahertz (GHz) to avoid excessive noise when the frequency is too high. In FIG. 2, among the peripheral control device PD, the coupling device CT and the device under test EUT, a local area network (LAN) can be used for data transmission.

Figure 4:
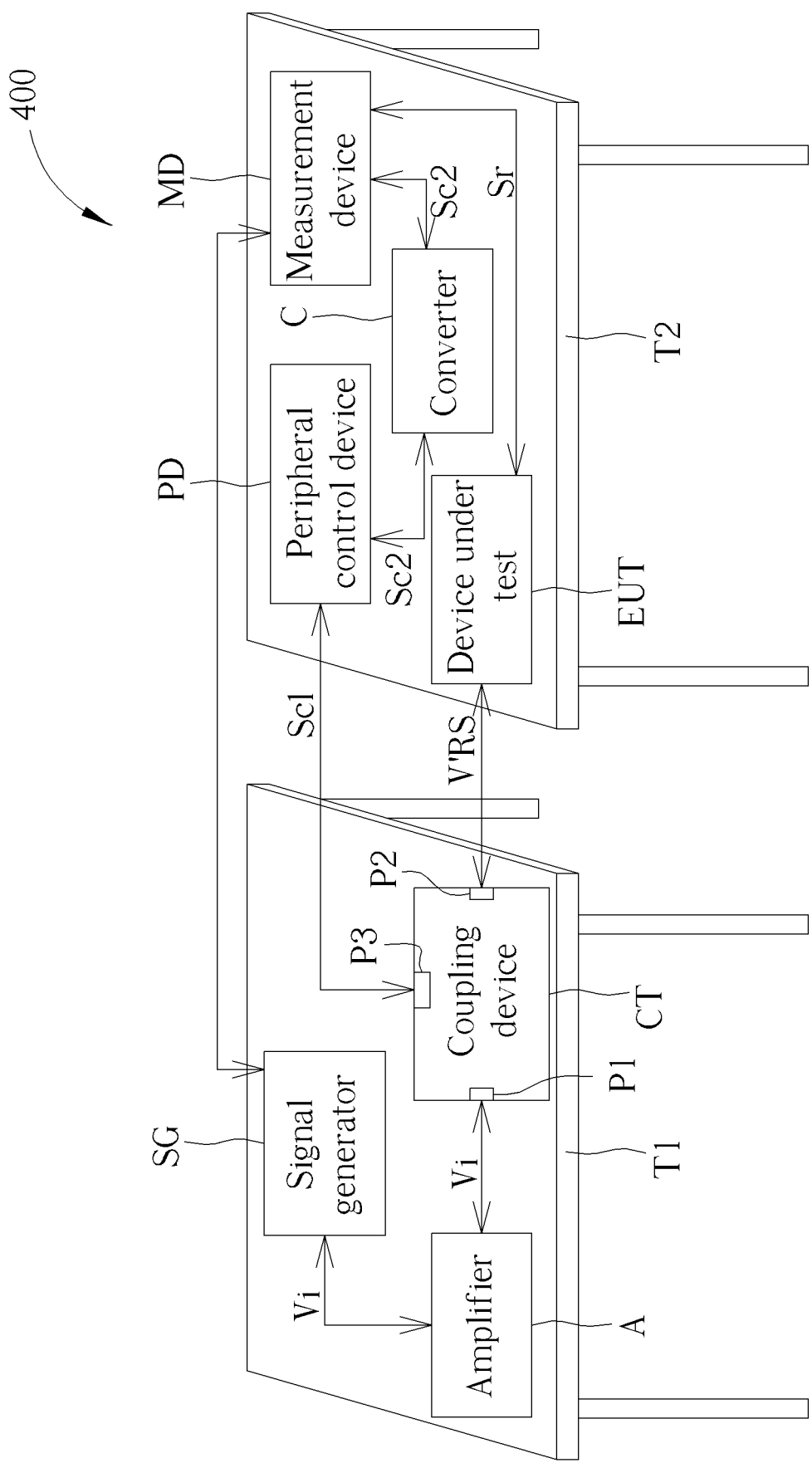
FIG. 4 illustrates a radiation susceptibility testing system according to an embodiment.

FIG. 4 illustrates a radiation susceptibility testing system 400 according to an embodiment. The radiation susceptibility testing system 400 can include the coupling device CT, the signal generator SG, the device under test EUT, the peripheral control device PD and the measurement device MD shown in FIG. 2. The peripheral control device PD can be coupled to the third terminal P3 of the coupling device CT for accessing the first control signal Sc1. The measurement device MD can be coupled to the peripheral control device PD and the device under test EUT for accessing a second control signal Sc2 and measuring the device under test EUT to generate a measurement result Sr when the coupling device CT outputs the second voltage V'RS to the device under test EUT.

The first control signal Sc1 can be related to the second control signal Sc2, the second control signal Sc2 can be related to the measurement result Sr, and the measurement result Sr can be corresponding to the impact of the radiation waves W to the device under test EUT. Hence, the measurement result Sr can be used to analyze the impact and interference caused by the radiation waves W to the device under test EUT.

As shown in FIG. 4, the radiation susceptibility testing system 400 can optionally include a converter C coupled to the peripheral control device PD and the measurement device MD. For example, the converter C can be a converter between a universal serial bus (USB) and a general purpose interface bus (GPIB). The radiation susceptibility testing system 400 can optionally include an amplifier A coupled to the signal generator SG and the first terminal P1 of the coupling device CT for amplifying the reference voltage Vi.

The peripheral control device PD in FIG. 4 can include a desktop computer, a server, a laptop computer, a tablet computer and/or a computing device for performing related controls. The measurement device MD in FIG. 4 can include an oscilloscope, such as a digital storage oscilloscope (DSO).

In FIG. 4, a general purpose interface bus (GPIB) interface can be used for the path between the signal generator SG and the measurement device MD. The path between the signal generator SG and the coupling device CT can be a voltage charge path for transmitting the reference voltage Vi and the amplified reference voltage Vi.

The path between the coupling device CT and the peripheral control device PD and the path between the coupling device CT and the device under test EUT can be test paths for accessing test-related signals and voltages. For example, on the path between the coupling device CT and the device under test EUT, the second voltage V'RS can be transmitted on a local area network (LAN).

The path between the peripheral control device PD and the measurement device MD and the path between the signal generator SG and the measurement device MD can be control paths for controlling and monitoring the signal generator SG and the measurement device MD by the peripheral control device PD.

The path between the measurement device MD and the device under test EUT can be a measurement path. For example, an oscilloscope probe can be used to measure the device under test EUT through the measurement path.

As shown in FIG. 4, the signal generator SG, the amplifier A and the coupling device CT can be placed on a working table T1, and the device under test EUT, the peripheral control device PD, the converter C and the measurement device MD can be placed on a working table T2 for simulating the radiation susceptibility test.

Figure 5:
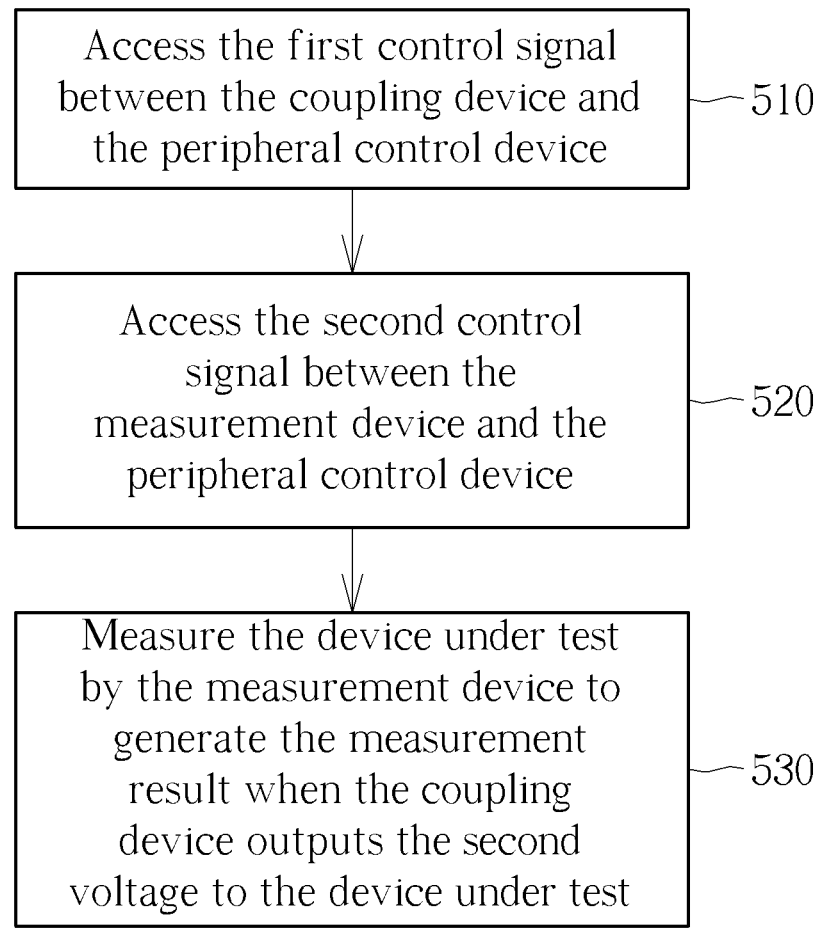
FIG. 5 illustrates a flowchart of testing radiation susceptibility using the radiation susceptibility testing system in FIG. 4.

FIG. 5 illustrates a flowchart of testing radiation susceptibility using the radiation susceptibility testing system 400 in FIG. 4. As shown in FIG. 5, the following steps can be performed.

Step 510: access the first control signal Sc1 between the coupling device CT and the peripheral control device PD;

Step 520: access the second control signal Sc2 between the measurement device MD and the peripheral control device PD; and Step 530: measure the device under test EUT by the measurement device MD to generate the measurement result Sr when the coupling device CT outputs the second voltage V'RS to the device under test EUT.

Step 360 in FIG. 3 can include Step 510 to Step 530 in FIG. 5. By using the peripheral control device PD for related controls, the reference voltage Vi can be used to generate the second voltage V'RS to simulate the radiation susceptibility test.

Figure 6:
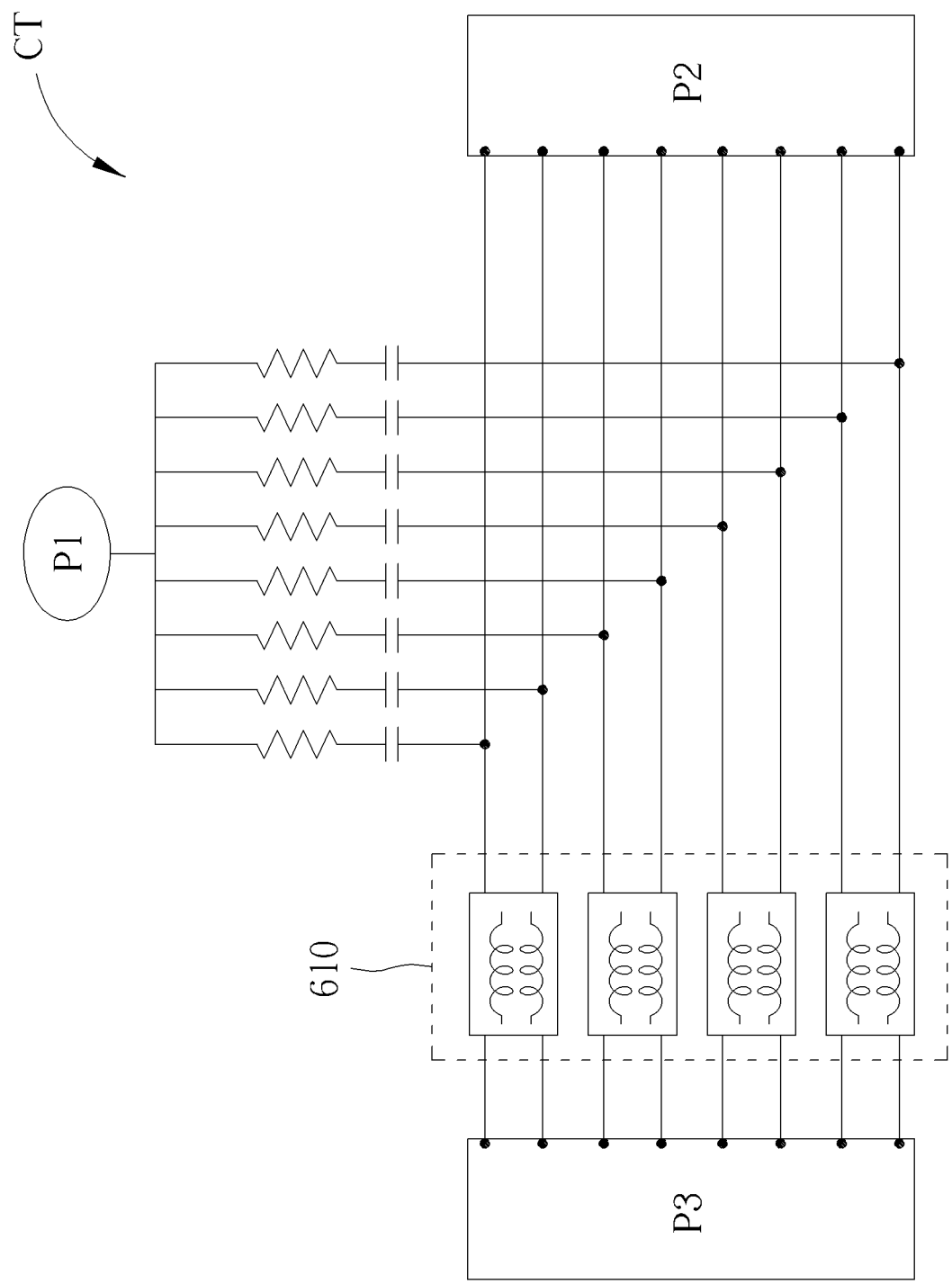
FIG. 6 illustrates the coupling device in FIG. 2 and FIG. 4.

FIG. 6 illustrates the coupling device CT in FIG. 2 and FIG. 4. The coupling device CT can include a set of capacitors and a set of resistors coupled to the first terminal P1. The coupling device CT can further include a choke circuit 610 coupled to the third terminal P3. The choke circuit 610 can include a common mode choke. The choke circuit 610 can reduce or even block the interference of the second voltage VR'S to the peripheral control device PD. For example, a SubMiniature (SMA) connector can be coupled to the first terminal P1. A first registered jack (RJ) connector (e.g. RJ45 connector) can be coupled to the second terminal P2. A second registered jack connector (e.g. RJ45 connector) can be coupled to the third terminal P3. The external structure of the coupling device CT can be, for example, a cube with suitable heat dissipation holes. For example, the length, width and height of the coupling device CT can be (but not limited to) 180 mm, 180 mm and 50 mm, and the RJ45 connectors of the second terminal P2 and the third terminal P3 can be disposed on the same face of the cube. By modifying the coupling device CT, not only the RJ45 connector can be used, but other connectors, such as universal serial bus (USB) connectors, can also be utilized.

In summary, with the radiation susceptibility testing method 300 and radiation susceptibility testing system 400, initial measurement and calibration can be performed in the anechoic chamber 110, and then the signal generator SG can be used to generate the corresponding reference voltage Vi so as to generate the second voltage V'RS to simulate the interference and impact of the radiation waves W to the device under test EUT. Since it is no longer necessary for users to repeatedly enter the anechoic chamber 110, the health and safety of users are improved, the cost of equipment and time is reduced, and it is more convenient to debug and analyze failures. The radiation susceptibility testing method 300 and radiation susceptibility testing system 400 can be used for testing a server for reducing the impact of radiation waves to the server, improving the stability and reliability of the server, and making the server more suitable for artificial intelligence (AI) computing and edge computing and more suitable for being used as a 5G communication server, a cloud sever or a vehicle-to-everything (V2X) server.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radiation susceptibility testing method, comprising:
   transmitting radiation waves to a device under test by an antenna;
   measuring the device under test to obtain a first voltage according to the radiation waves;
   outputting a reference voltage to a coupling device so that the coupling device generates a second voltage according to the reference voltage;
   adjusting the reference voltage to approximate the second voltage to the first voltage;
   storing the adjusted reference voltage; and
   outputting the approximated second voltage to the device under test according to the adjusted reference voltage to simulate an impact of the radiation waves to the device under test.

2. The radiation susceptibility testing method of claim 1, wherein:
   the radiation waves have a first frequency, and the adjusted reference voltage is corresponding to the first frequency; and
   the radiation susceptibility testing method further comprises:
   adjusting the radiation waves from the first frequency to a second frequency to further generate a second reference voltage corresponding to the second frequency.

3. The radiation susceptibility testing method of claim 1, wherein the reference voltage is positively correlated to a sum of the second voltage and a calibration factor.

4. The radiation susceptibility testing method of claim 1, further comprising:
   accessing a first control signal between the coupling device and a peripheral control device;
   accessing a second control signal between a measurement device and the peripheral control device; and
   measuring the device under test by the measurement device to generate a measurement result when the coupling device outputs the second voltage to the device under test;
   wherein the first control signal is related to the second control signal, the second control signal is related to the measurement result, and the measurement result is corresponding to the impact of the radiation waves to the device under test.

5. A radiation susceptibility testing system, comprising:
   an antenna configured to transmit radiation waves to a device under test;
   a measurement device configured to measure the device under test to obtain a first voltage according to the radiation waves;
   a coupling device comprising a first terminal, a second terminal and a third terminal;

a signal generator configured to output a reference voltage to the first terminal so that the coupling device generates a second voltage according to the reference voltage; and the device under test coupled to the second terminal of the coupling device and configured to receive the second voltage;

wherein the signal generator is further configured to adjust the reference voltage to the first terminal so that the coupling device approximates the second voltage to the first voltage and outputs the approximate second voltage to the device under test according to the adjusted reference voltage simulate the impact of the radiation waves to the device under test.

6. The radiation susceptibility testing system of claim 5, further comprising:

a peripheral control device coupled to the third terminal of the coupling device and configured to access a first control signal; and a measurement device coupled to the peripheral control device and the device under test and configured to access a second control signal and measure the device under test to generate a measurement result when the coupling device outputs the second voltage to the device under test;

wherein the first control signal is related to the second control signal, the second control signal is related to the measurement result, and the measurement result is corresponding to the impact of the radiation waves to the device under test.

7. The radiation susceptibility testing system of claim 6, wherein:

the peripheral control device comprises a desktop computer, a server, a laptop computer, a tablet computer and/or a computing device; and the measurement device comprises an oscilloscope.

8. The radiation susceptibility testing system of claim 5, wherein the device under test comprises a network cable and a network connector.

9. The radiation susceptibility testing system of claim 5, wherein the coupling device comprises:

a SubMiniature (SMA) connector coupled to the first terminal;

a first registered jack (RJ) connector coupled to the second terminal;

a second registered jack connector coupled to the third terminal; and a choke circuit coupled to the third terminal.

10. The radiation susceptibility testing system of claim 5, further comprising:

an amplifier coupled to the signal generator and the first terminal of the coupling device and configured to amplify the reference voltage.

* * * * *